United States Patent
Huang et al.

(10) Patent No.: US 9,129,883 B2
(45) Date of Patent: Sep. 8, 2015

(54) PACKAGE STRUCTURE OF OPTICAL TRANSCEIVER COMPONENT

(71) Applicant: LuxNet Corporation, Zhongli, Taoyuan County (TW)

(72) Inventors: Yun-Cheng Huang, Zhongli (TW); Chien-Wen Lu, Zhongli (TW); Chung Hsin Fu, Zhongli (TW); Chi-Min Ting, Zhongli (TW); Tsing-Chow Wang, Zhongli (TW)

(73) Assignee: LUXNET CORPORATION, Zhongli, Taoyuan County (TW)

( * ) Notice: Subject to any disclaimer, the term of this patent is extended or adjusted under 35 U.S.C. 154(b) by 62 days.

(21) Appl. No.: 14/183,328

(22) Filed: Feb. 18, 2014

(65) Prior Publication Data

US 2014/0239315 A1 Aug. 28, 2014

(30) Foreign Application Priority Data

Feb. 23, 2013 (TW) .............................. 102106375 A

(51) Int. Cl.
| | | |
|---|---|---|
| *H01L 31/12* | (2006.01) | |
| *H01L 21/00* | (2006.01) | |
| *H01L 25/16* | (2006.01) | |
| *H01L 27/146* | (2006.01) | |
| *H01L 33/62* | (2010.01) | |
| *H01L 25/075* | (2006.01) | |
| *H01L 31/0232* | (2014.01) | |
| *H01L 31/173* | (2006.01) | |
| *H01L 31/0203* | (2014.01) | |
| *H01L 23/00* | (2006.01) | |

(52) U.S. Cl.
CPC .......... *H01L 25/167* (2013.01); *H01L 25/0753* (2013.01); *H01L 27/14685* (2013.01); *H01L 31/0232* (2013.01); *H01L 31/173* (2013.01); *H01L 33/62* (2013.01); *H01L 24/85* (2013.01); *H01L 31/0203* (2013.01); *H01L 2224/48091* (2013.01); *H01L 2924/12041* (2013.01)

(58) Field of Classification Search
CPC ................... H01L 2924/12041; H01L 25/167; H01L 25/0753; H01L 31/0232; H01L 21/49; H01L 24/85; H01L 31/173; H01L 33/62; H01L 31/0203; H01L 27/14685
See application file for complete search history.

(56) References Cited

U.S. PATENT DOCUMENTS

| | | | | |
|---|---|---|---|---|
| 5,252,856 | A * | 10/1993 | Murai ........................... | 257/678 |
| 5,859,423 | A * | 1/1999 | Shimoyama et al. ....... | 250/214.1 |
| 6,340,831 | B1 * | 1/2002 | Kuhara et al. ................ | 257/461 |
| 7,482,237 | B2 * | 1/2009 | Sugawara ..................... | 438/317 |
| 7,772,594 | B2 * | 8/2010 | Sugawara et al. .............. | 257/76 |
| 2005/0138934 | A1 * | 6/2005 | Weigert et al. ................... | 62/3.2 |
| 2008/0204115 | A1 * | 8/2008 | Sugawara ..................... | 327/512 |
| 2009/0072356 | A1 * | 3/2009 | Sugawara ..................... | 257/632 |

* cited by examiner

*Primary Examiner* — Alonzo Chambliss

(74) *Attorney, Agent, or Firm* — Muncy, Geissler, Olds & Lowe, P.C.

(57) ABSTRACT

The invention provides a package structure of optical transceiver component, comprising: a metal base; a plurality of pins, at least one optical emitting diode and/or at least one optical receiving diode; wherein the pins are provided and passed through the metal base and insulated with the metal base by using an insulating material; the optical emitting diode and the optical receiving diode are each mounted on the metal base through a sub-mount, respectively. The optical emitting diode/optical receiving diode is connected to the pins neighboring therewith by a wire directly or through the sub-mount, when set the top surface of the pins be a reference level, at least one of the top surfaces of the optical emitting diode, the optical receiving diode, and sub-mount is flush with the reference level.

9 Claims, 7 Drawing Sheets

PACKAGE STRUCTURE OF OPTICAL TRANSCEIVER COMPONENT

BACKGROUND OF THE INVENTION

1. Field of the Invention

The present invention relates to a package structure of optical transceiver component. In particular, the present invention relates to a package structure of optical transceiver component facilitating impedance matching and reducing the simultaneously switching noise.

2. Description of the Related Art

Optical transceivers have been widely used in the optical fiber communication system, and are important mediators of transformation between an optical signal and an electric signal. The conventional package structure of optical transceiver component, as shown in FIG. 1 and FIG. 2, general comprises an optical transceiver which includes a transmitting optical subassembly 200 (TOSA) for transmitting an optical signal and a receiving optical subassembly 300 (ROSA) for receiving an optical signal.

In the package structure, both of the transmitting optical subassembly 200 and the receiving optical subassembly 300 contain a metal base, and a laser diode (LD)/photo diode (PD) mounted on the metal base through a sub-mount, and there are two pins provided and passed through the metal base beside the laser diode/photo diode, and the laser diode/photo diode is electrically connected to the pins via wire 400 by a wire bonding process.

The sub-mount generally consists of a passive component on which top and bottom sides are covered with a conductive layer. One side of the passive component contacts with the bottom surface of the laser diode/photo diode, and the other side contacts with the top surface of the metal base. In the sequent wire bonding process, the laser diode/photo diode is connected to the pins via the wire 400 directly or through the sub-mount so that the laser diode/photo diode is electronically connected to the circuit layout on the circuit board to transmit the electric signal.

Regarding the traditional package structure, since the height of the sub-mounts is not uniform, the top surfaces of the laser diodes and the photo diodes are not same level upon mounting on the submount, which results in the bonding wires 400 in different lengths. If the wire 400 is too long, it would cause a high inductance value which in turn yield a simultaneously switching noise disturbing the circuit function. Accordingly, there remains a need of an effective way to solve the above problem.

SUMMARY OF THE INVENTION

The purpose of present invention is to provide a package structure of optical transceiver component for solving the foregoing problem about the circuit interference caused by the simultaneously switching noise due to the different lengths of the wires bonding the components, and is to provide a package structure of optical transceiver component having excellent impedance matching.

To solve the foregoing problem, one aspect of the present invention is to provide a package structure of optical transceiver component, which comprises: a metal base; a plurality of pins, which are provided and passed through the metal base and are insulated with the metal base by using an insulating material, wherein the height of the each pins above the surface of the metal base is the same; at least one grounding pin, which is connected to the metal base; at least one optical emitting diode, which is mounted on the metal base through a sub-mount; and/or at least one optical receiving diode, which is mounted on the metal base through another sub-mount; and the optical emitting diode and/or the optical receiving diode is electronically connected to the pins neighboring therewith via a wire directly or through the sub-mount, which package structure is characterized that when set the top surface of the pins be a reference level, at least one of the following conditions is satisfied: (1) the top surface of the optical emitting diode and for the top surface of the sub-mount mounting the optical emitting diode is flush with the reference level; and (2) the top surface of the optical receiving diode and for the top surface of the sub-mount mounting the optical receiving diode is flush with the reference level. In the present package structure, it is preferable that said optical emitting diode/optical receiving diode is electronically connected to the pins neighboring therewith via the wire, and is electronically connected to another pin neighboring therewith via the wire through the sub-mount for mounting the optical emitting diode/optical receiving diode. In the present package structure, it is preferable that said optical emitting diode and the optical receiving diode are each electronically connected to the two pins neighboring therewith via the wire.

In the present package structure, it is preferable that the top surface of one or both the optical emitting diode and the optical receiving diode is flush with the reference level.

In the present package structure, it is preferable that the top surfaces of one or both the sub-mount for mounting the optical emitting diode and the sub-mount for mounting the optical receiving diode is flush with the reference level.

In the present package structure, it is preferable that one or both the sub-mount for mounting the optical emitting diode and the sub-mount for mounting the optical receiving diode further comprises a high stage portion and a low stage portion, and the optical emitting diode and/or the optical receiving diode are/is located on the low stage portion so that the top surface of the diodes is flush with the top surface of the high stage portion and the reference level. In the present package structure, it is preferable that said sub-mount is an insulating substrate on which top surface is plated with a metal film.

In the present package structure, it is preferable that said sub-mount is electronically connected to the pin via a matching resistor other than via the wire.

In the present package structure, it is preferable that said sub-mount is an insulating substrate on which top surface is plated with a metal film.

Therefore, the present invention attains the following benefits:

1. The top surfaces of the sub-mount, the optical emitting diode and/or the optical receiving diode are flush with the top surface of the pins by adjusting the thickness of the sub-mount; therefore, the length of the wire for bonding the above mentioned components and the pins is fixed and can be controlled in a short range. Thereby, the mutual induction between the transmission pathway and other circuit is inhibited, and thus reduce the disturbance of the simultaneously switching noise. In addition, the complexity of impedance matching is simplified due to the controlled wire length.

2. By allowing the top surface of the sub-mount be flush with the top surface of the pins, the bonding can be achieved by the surface mount technology (SMT) or other ways, or the wire for bonding the sub-mount and the pin can be replaced with a passive component. Using the passive component can eliminate the use of capacitors and inductors in the circuit, to impart impedance matching. Thus the present package structure increases the design flexibility.

To improve understanding of the different aspects of the disclosure, the techniques employed in the patent invention to achieve the foregoing problems, characteristics and effects thereof are described hereinafter by the way of examples with reference to the accompanying drawings.

BRIEF DESCRIPTION OF THE DRAWINGS

The invention is described in detail below with reference to the appended drawings, wherein like numerals designate similar parts.

FIG. 7-1 shows a smith chart of the package structure of optical transceiver component shown in FIG. 1.

FIG. 7-2 shows a smith chart of the package structure of optical transceiver component shown in FIG. 6.

DETAILED DESCRIPTION OF THE PREFERRED EMBODIMENTS

In the following detailed description, for purposes of explanation, numerous specific details are set forth in order to provide a thorough understanding of the disclosed embodiments. As those skilled in the art would recognize, modifications within the spirit and scope of the invention will be readily apparent to those of skill in the art. In addition, it should be understood that aspects of the invention and portions of various embodiments and various features recited below and/or in the appended claims may be combined or interchanged either in whole or in part. Furthermore, those of ordinary skill in the art will appreciate that the following description is by way of example only, and is not intended to limit the invention.

In addition, the scale of the figures may not be drawn in its actual proportion but may be exaggerated for the convenience of illustration. The figures and its scale are not restrictive to the present invention.

The present invention provides a package structure of optical transceiver component, comprising: a metal base; a plurality of pins, which are provided and passed through the metal base, and are insulated with the metal base by using an insulating material, wherein the height of the each pins above the surface of the metal base is the same; at least one grounding pin, which is connected to the metal base; at least one optical emitting diode, which is mounted on the metal base through a sub-mount; and/or at least one optical receiving diode, which is mounted on the metal base through another sub-mount, wherein the sub-mounts are an insulating base on which top surface is plated with a metal film, and the optical emitting diode and the optical receiving diode are electronically connected to the pins neighboring therewith via a wire directly or through the sub-mount; when set the top surface of the pins be a reference level 13, at least one of the following conditions is satisfied: (1) the top surface of the optical emitting diode and/or the top surface of the sub-mount for mounting the optical emitting diode is flush with the reference level; and (2) the top surface of the optical receiving diode and/or the top surface of the sub-mount for mounting the optical receiving diode is flush with the reference level.

The term "top surface" used herein refers to the highest flat surface toward to upside of the described components in the figure; for example, if the sub-mount is in a form of staged portions, the top surface refers to the highest flat surface of the highest stage portion among the stage portions.

Figure 3:
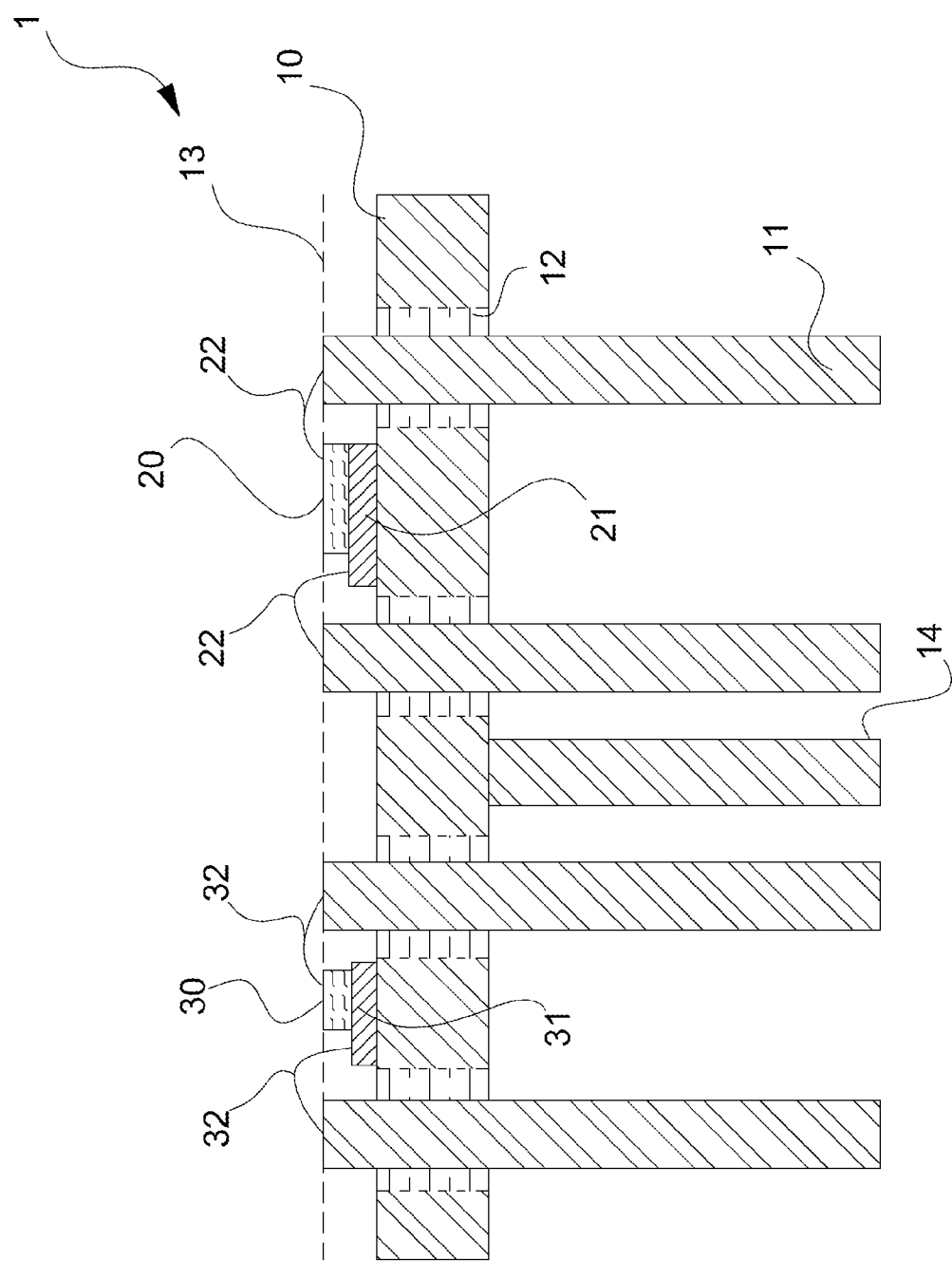
FIG. 3 shows a cross-sectional drawing of the first embodiment of the present invention.

First, please refer to FIG. 3 which shows a cross-sectional drawing of the first embodiment of the present invention. As shown in FIG. 3, the package structure 1 of the optical transceiver component of the present invention comprises a metal base 10; a plurality of pins 11, which are provided and passed through the metal base 10 and are insulated with the metal base 10 by using an insulating material 12; at least one grounding pin 14, which is connected to the metal base 10; at least one optical emitting diode 20, which is mounted on the metal base 10 through a sub-mount 21; at least one optical receiving diode 30, which is mounted on the metal base 10 through another sub-mount 31, wherein the sub-mounts 21,31 are an insulating base on which top surface is plated with a metal film. The optical emitting diode 20 and the optical receiving diode 30 are each electronically connected to one of the pin 11 neighboring therewith via a wire 22, 32 directly, and are electronically connected to the another pin 11 via another wire 22, 32 through the sub-mounts 21. 31. The top surfaces of the optical emitting diode 20 and of the optical receiving diode 30 are flush with the top surface of the pins 11 (i.e., the reference level 13). Accordingly, the distance between the optical emitting diode 20/the optical receiving diode 30 and the pins 11 is the shortest. Therefore, the wire 22, 32 for bonding the optical emitting diode 20/the optical receiving diode 30 and the pins 11 is also short so that the mutual inductance between adjacent circuits is suppressed, and the disturbance of the simultaneously switching noise is also reduced. Also, since the length of the wires 22, 32 for connecting the optical emitting diode 20/the optical receiving diode 30 and the pins 11 is uniform, the complexity of impedance matching is simplified.

In addition, although the optical emitting diode is designated as 20 and the optical receiving diode is designated as 30 in the Figures, it is just an example, and is not to restrict the optical emitting diode 20 to be set on the right side in the Figure. Namely, the positions of the optical emitting diode 20 and the optical receiving diode 30 are exchangeable; it is also possible to comprise only one type of the diodes in the present invention, i.e. only the optical emitting diode 20 or only the optical receiving diode. The connection of the components in the Figures is only for illustrating. As long as that the metal base 10 is provided with an optical emitting diode 20 connecting to the two pins 11, an optical receiving diode 30 connecting to the two pins 11, and a ground pin 14, the configuration of the other components can be variable and is not restrict to those shown in the Figure.

Figure 4:
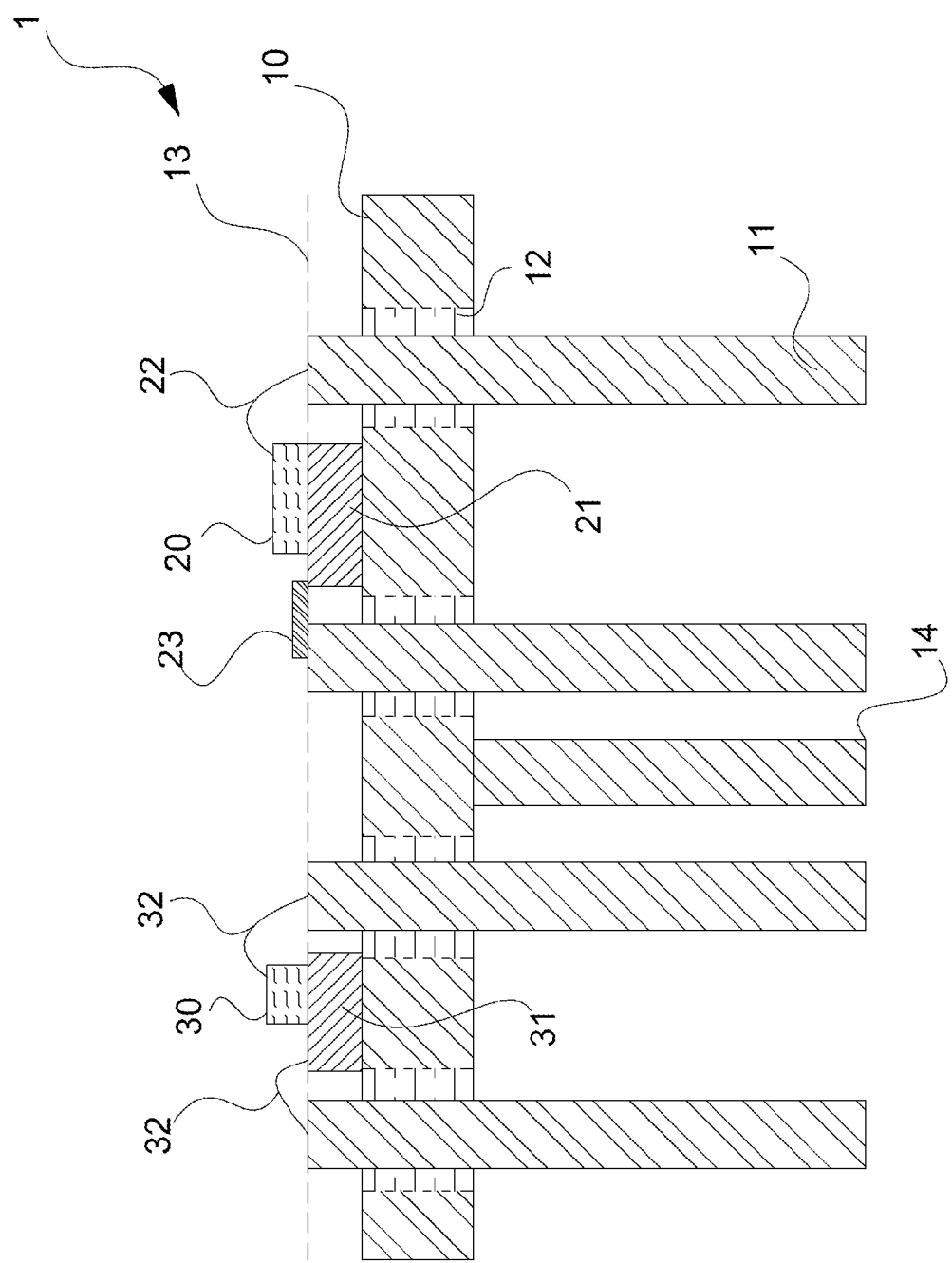
FIG. 4 shows a cross-sectional drawing of the second embodiment of the present invention.

Please refer to FIG. 4 which shows a cross-sectional drawing of the second embodiment of the present invention. The main structure shown in FIG. 4 is substantially the same as the package structure 1 of the optical transceiver component shown in FIG. 3; the only difference is that the top surface of the sub-mount 21 for mounting the optical emitting diode 20 and the top surface of the sub-mount 31 for mounting the optical emitting diode 30 are flush with the top surface of the pins 11 (i.e., the reference level 13). According to this configuration, the distance between the sub-mount 21, 31 and the pins 11 is the shortest. Therefore, the wire 22, 32 for bonding the sub-mount 21, 31 and the pins 11 is also short so that the mutual inductance between adjacent circuits is suppressed, and the disturbance of the simultaneously switching noise is also reduced. Also, since the length of the wire 22, 32 for bonding the sub-mount 21,31 and the pins 11 is uniform, the complexity of impedance matching is simplified. In addition, by allowing the top surfaces of the sub-mount 21 (for mounting the optical emitting diode 20)/the sub-mount 31 (for mounting the optical emitting diode 30) be flush with the surface of the pins 11, the wire 22/32 can be replaced with a passive component 23, 33 (such as a matching resistor) if it is required to reduce the inductance and capacitance of the package structure. In this regards, the impedance matching is simplified.

Figure 5:
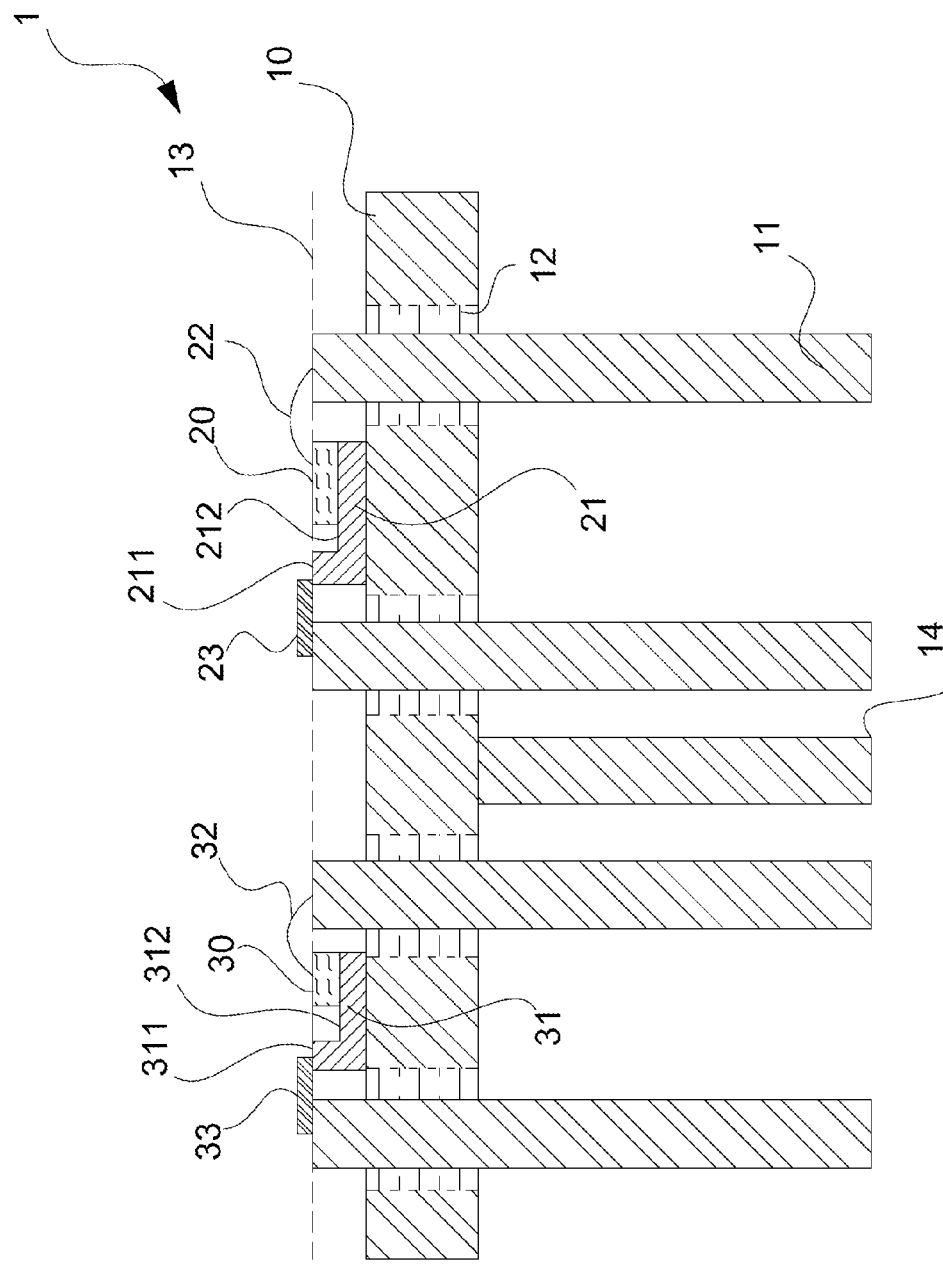
FIG. 5 shows a cross-sectional drawing of the third embodiment of the present invention.

Please refer to FIG. 5 which shows a cross-sectional drawing of the third embodiment of the present invention. The basic structure shown in FIG. 5 is substantially the same as the package structure 1 of the optical transceiver component shown in FIG. 3; the only difference is that the sub-mounts 21,31 is in a staged form which comprises a high stage portion 211,311 and a low stage portion 212,312, wherein the top surface of the high stage portion 211,311 is flush with the top surface of the pins 11; the optical emitting diode 20/the optical receiving diode 30 is located on the low stage portion 212,312, and the top surfaces of the optical emitting diode 20/the optical receiving diode 30 are flush with the top surface of the high stage portion 211,311. Accordingly, the top surfaces of the optical emitting diode 20/the optical receiving diode 30 are flush with both the top surface of the high stage portion 211,311 of the sub-mount 21/31 and the top surface of the pins 11. Therefore, the distance between the sub-mount 21/31 and the pins 11 and the distance between the optical emitting diode 20/the optical receiving diode 30 and the pins 11 are both the shortest, and the length of the wire 22, 32 is also short so that the mutual inductance between adjacent circuits is suppressed, and the disturbance of the simultaneously switching noise is also reduced. In addition, by allowing the top surface of the high stage portion 211,311 of the sub-mount 21/31 be flush with the surface of the pins 11, the wire 22,32 can be replaced with a passive component 23,33 (such as a matching resistor) if it is required to reduce the inductance and capacitance in the package structure. In this regard, the impedance matching is simplified.

Figure 6:
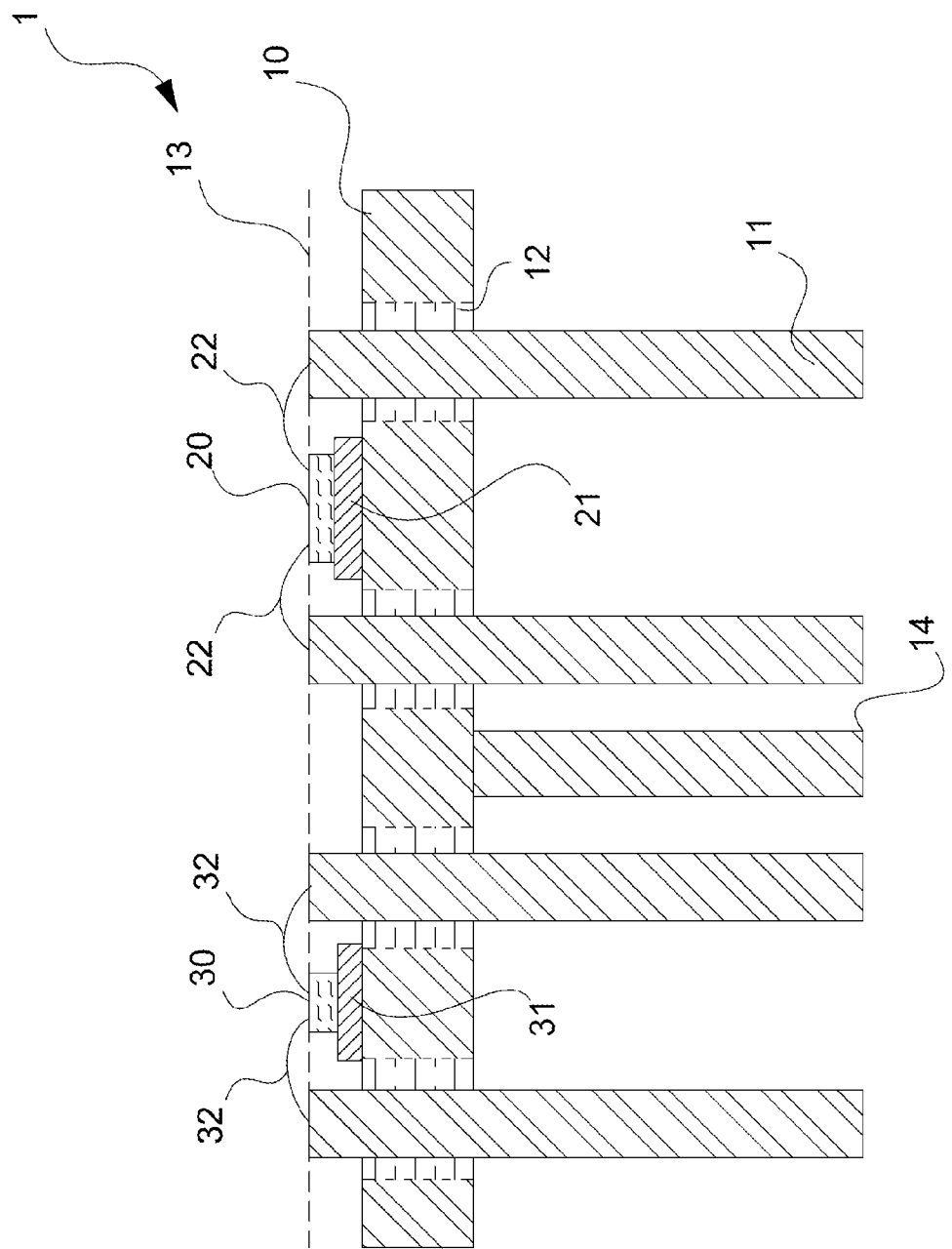
FIG. 6 shows a cross-sectional drawing of the fourth embodiment of the present invention.

Please refer to the FIG. 6 which shows a cross-sectional drawing of the fourth embodiment of the present invention. The main structure shown in FIG. 6 is substantially the same as the package structure 1 of the optical transceiver component shown in FIG. 3; the only difference is that the optical emitting diode 20 and the optical receiving diode 30 are both electronically connected to the pins 11 via the wire 22, 32. As mentioned above, the length of the wire 22, 32 is short so that the mutual inductance between adjacent circuits is suppressed, and the disturbance of the simultaneously switching noise is also reduced. Also, since the length of the wires 22, 32 is the same, the complexity of impedance matching is simplified.

The term "simultaneously switching noise" used herein refers to the signal interference caused by the mutual inductance between circuits under a high frequency environment. If the signal-to-noise ratio is low, it might cause a malfunction of the circuit. Therefore, the mutual inductance between the circuits must be controlled below a threshold value to ensure that the circuit function is stable. In a general condition of a communication equipment, a characteristic impedance is 50 ohm at an operating frequency of Giga Hz, and the threshold unit is in an order of nH, nano-henry. One of the specific means to suppress the mutual inductance between circuits is to widen the wire, and another way is to shorten the conduction pathway. However, the demanded package technique is to reduce the volume after packaging as possible, so expanding the width of the wire contradicts the concept. Therefore, shortening of the length of each conduction pathway is an ideal selection.

Figure 1:
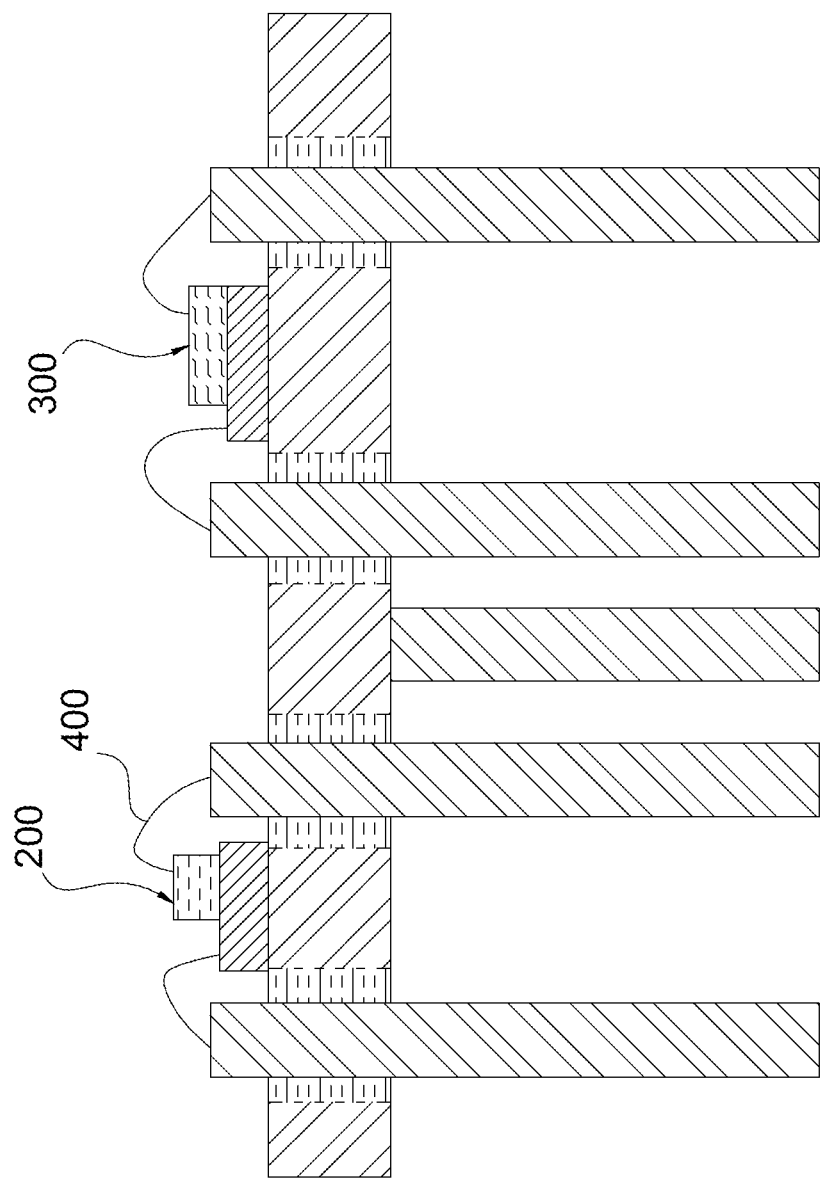
FIG. 1 shows a cross-sectional drawing of a package structure of optical transceiver of the prior art.
Figure 2:
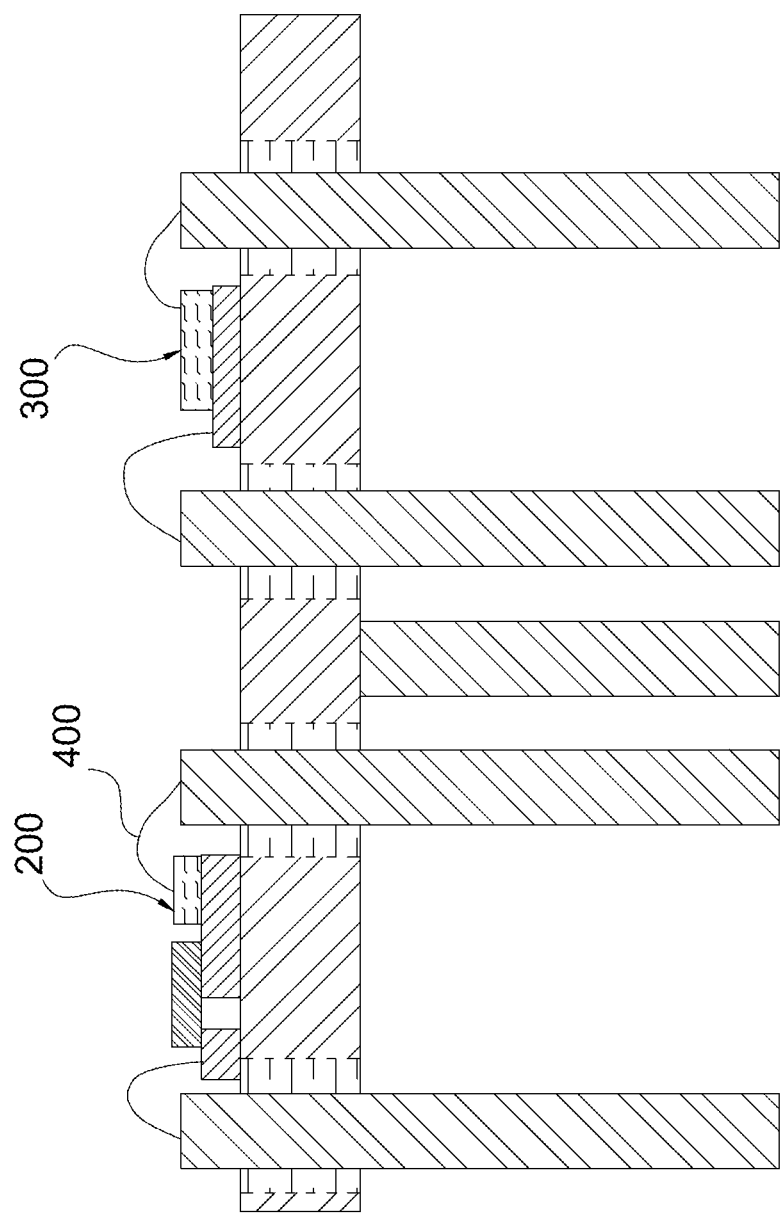
FIG. 2 shows a cross-sectional drawing of another package structure of optical transceiver of the prior art.
Figures 1, 7:
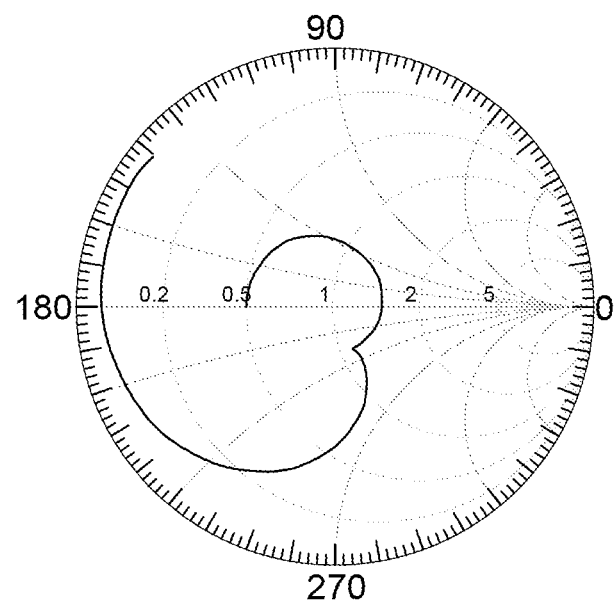
Figures 2, 7:
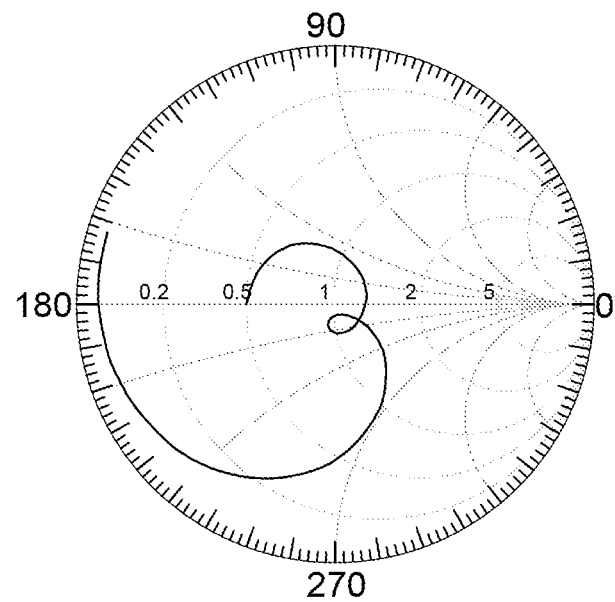

Please refer to FIG. 7-1 which shows a smith chart of the package structure of optical transceiver component of the prior art as shown in FIG. 1, and FIG. 7-2 which shows a smith chart of the package structure of optical transceiver component as shown in FIG. 6. After comparing the two Figures, it is known that the inductive component on the smith chart of the present package structure is smaller than the prior art, which proves that each conduction pathway between each elements is shortened by allowing the top surface of the optical emitting diode 20, the optical receiving diode 30, and the sub-mount 21, 31, be flush with the top surface of the pins 11 (i.e., reference level 13). The mutual inductance is proportional to the self-inductance; therefore, reducing the self-inductance of the circuit can also suppress the mutual inductance between the circuits and thus reduce the circuit interference caused by the simultaneously switching noise.

The term "impedance matching" used herein refers to the designation of circuit for transferring the largest power from power supply to a load terminal under a high frequency environment. The capacitor and inductor are reactive components, and although the reactance generated by the capacitor and inductor does not consume power, it reflects the power back to the power supply, that is called "return loss." In order to diminish the return loss so as to improve energy efficiency, the characteristic that capacitive reactance and inductive reactance have a 180 degree phase difference can be used by connecting the capacitor and inductor in series or parallel to offset the reactance to 0 to avoid wasting power or prevent the power loss in transmission. The particular matching method is to connect the capacitor/inductor in series or parallel in the circuit to change the reactance. When a transmission line is utilized as a transmission path, the impedance can be matched by adjusting the length of the transmission line. In addition, when the characteristic impedance from the signal source to the load is equal to the characteristic impedance of load, the load can reach the largest power, that is called the "maximum power transfer theorem." Therefore, it must to be considered whether the characteristic impedance of load and the impedance of the transmission path are balanced for impedance matching.

The term "passive component 23, 33" used herein refers to an electronic component which does not carry any power source, such as doping component, capacitive component or matching resistor. The passive component can be used for impedance matching or coordinating to other electronic circuits and the passive component connects the pins with the diodes or the sub-mounts 21/31 via SMT or electrical glues to conduct two terminal of the passive component. The exemplary embodiment is only for illustrating other than restricting.

In conclusion from above, the package structure of the optical transceiver component of the present invention are provided via adjusting the thickness of the sub-mount, so that at least one of the top surfaces of the sub-mount, the optical emitting diode or the optical receiving diode is flush with the top surface of the pins to ensure that the length of the wire for bonding as well as the signal transmission path is short, thereby reducing the inductance of each circuit and inhibiting the mutual inductance between circuits to suppress the interference form simultaneously switching noise. On the other hand, since the top surface of the sub-mount is flush with the top surface of the pins, the wire can be replaced with a passive component (such as a matching resistor) to simplify the complexity of impedance matching.

While the present invention has been described in connection with certain exemplary embodiments, it is to be understood that the invention is not limited to the disclosed embodiment, but, on the contrary, is intended to cover various modifications and equivalent arrangement include within the spirit and scope of the appended claim, and equivalent thereof.

What is claimed is:

1. A package structure of optical transceiver component, comprising:
   a metal base;
   a plurality of pins, which are provided and passed through the metal base and insulted with the metal base by using an insulating material, wherein the height of the each pins above the surface of the metal base is the same;
   at least one grounding pin, which is connected to the metal base;
   at least one optical emitting diode, which is mounted on the metal base through a sub-mount; and/or
   at least one optical receiving diode, which is mounted on the metal base through another sub-mount; and
   the optical emitting diode and/or the optical receiving diode is electronically connected to the pins neighboring therewith via a wire directly or through the sub-mount, which package structure is characterized that when set the top surface of the pins be a reference level, at least one of the following conditions is satisfied:
   (1) the top surface of the optical emitting diode and/or the top surface of the sub-mount for mounting the optical emitting diode is flush with the reference level; and
   (2) the top surface of the optical receiving diode and/or the top surface of the sub-mount for mounting the optical receiving diode is flush with the reference level.

2. The package structure of optical transceiver component of claim 1, wherein the optical emitting diode/optical receiving diode is electronically connected to pins neighboring therewith via the wire and is electronically connected to another pin neighboring therewith via the wire through the sub-mount for mounting the optical emitting diode/optical receiving diode.

3. The package structure of optical transceiver component of claim 2, wherein the sub-mount is electronically connected to the pin via a matching resistor other than via the wire.

4. The package structure of optical transceiver component of claim 3, wherein the sub-mount is an insulating substrate on which top surface is plated with a metal film.

5. The package structure of optical transceiver component of claim 1, wherein the optical emitting diode and the optical receiving diode are each electronically connected to the two pins neighboring therewith via the wires directly.

6. The package structure of optical transceiver component of claim 1, wherein the top surface of one or both the optical emitting diode and the optical receiving diode is flush with the reference level.

7. The package structure of optical transceiver component of claim 1, wherein the top surface of one or both the sub-mount for mounting the optical emitting diode and the sub-mount for mounting the optical receiving diode is flush with the reference level.

8. The package structure of optical transceiver component of claim 1, wherein one or both the sub-mount for mounting the optical emitting diode and the sub-mount for mounting the optical receiving diode further comprises a high stage portion and a low stage portion, and the optical emitting diode and/or the optical receiving diode are/is located on the low stage portion so that the top surface of the diodes is flush with the top surface of the high stage portion and the reference level.

9. The package structure of optical transceiver component of claim 1, wherein the sub-mount is an insulating substrate on which top surface is plated with a metal film.

* * * * *